US008377829B2

(12) United States Patent
Yeh et al.

(10) Patent No.: US 8,377,829 B2
(45) Date of Patent: Feb. 19, 2013

(54) METHOD OF MANUFACTURING A CAPACITOR DEEP TRENCH AND OF ETCHING A DEEP TRENCH OPENING

(75) Inventors: Ta-Chuan Yeh, Taipei (TW); Ni-Min Chung, Nan-Tou Hsien (TW); Kao-Su Huang, Tainan Hsien (TW); Yung-Chang Lin, Tai-Chung Hsien (TW); Ruey-Chyr Lee, Tai-Chung (TW); Chien-Kuo Wang, Tainan Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 1059 days.

(21) Appl. No.: 11/871,166

(22) Filed: Oct. 12, 2007

(65) Prior Publication Data

US 2008/0038931 A1 Feb. 14, 2008

Related U.S. Application Data

(62) Division of application No. 11/306,560, filed on Jan. 3, 2006, now Pat. No. 7,344,954.

(51) Int. Cl.

| | |
|---|---|
| ***H01L 21/302*** | (2006.01) |
| ***H01L 21/461*** | (2006.01) |
| ***B44C 1/22*** | (2006.01) |
| ***C03C 15/00*** | (2006.01) |
| ***C03C 25/68*** | (2006.01) |
| ***C23F 1/00*** | (2006.01) |

(52) U.S. Cl. ........ 438/740; 438/689; 438/706; 438/710; 216/58; 216/67

(58) Field of Classification Search .................. 438/740
See application file for complete search history.

(56) References Cited

U.S. PATENT DOCUMENTS

| | | | | |
|---|---|---|---|---|
| 4,477,310 | A | 10/1984 | Park | |
| 4,486,266 | A | 12/1984 | Yamaguchi | |
| 6,103,632 | A | 8/2000 | Kumar | |
| 6,281,069 | B1 | 8/2001 | Wu | |
| 6,310,375 | B1 | 10/2001 | Schrems | |
| 6,368,912 | B1 | 4/2002 | Chang | |
| 6,491,835 | B1 * | 12/2002 | Kumar et al. | 216/51 |
| 6,544,838 | B2 * | 4/2003 | Mathad et al. | 438/244 |
| 6,630,379 | B2 * | 10/2003 | Mandelman et al. | 438/243 |
| 6,660,581 | B1 | 12/2003 | Yang | |
| 6,696,365 | B2 | 2/2004 | Kumar | |
| 6,881,620 | B1 | 4/2005 | Lai | |
| 6,916,721 | B2 | 7/2005 | Heineck | |
| 6,917,064 | B2 | 7/2005 | Kito | |
| 6,939,805 | B2 | 9/2005 | Lutzen | |
| 6,946,344 | B2 | 9/2005 | Chou | |
| 6,960,503 | B2 | 11/2005 | Hsu | |
| 6,964,898 | B1 | 11/2005 | Cheng | |
| 6,979,613 | B1 | 12/2005 | Wu | |

(Continued)

FOREIGN PATENT DOCUMENTS

| | | |
|---|---|---|
| TW | 448564 | 8/2001 |
| TW | 463295 | 11/2001 |

(Continued)

*Primary Examiner* — Nadine Norton
*Assistant Examiner* — Stephanie Duclair
(74) *Attorney, Agent, or Firm* — Winston Hsu; Scott Margo

(57) ABSTRACT

A substrate is provided having an oxide layer, a first nitride-silicon, a STI, and a second nitride-silicon. A pattern poly-silicon layer on the second nitride-silicon layer is etched to form a deep trench opening. Etching the pattern poly-silicon layer also deepens the deep trench opening. Then, a conductive layer is filled in the deep trench opening.

17 Claims, 10 Drawing Sheets

60
70
72
84
84
74
66
64
68
68
62

U.S. PATENT DOCUMENTS

| | | | | |
|---|---|---|---|---|
| 7,029,753 | B2 * | 4/2006 | Tzou et al. | 428/426 |
| 2002/0066884 | A1 * | 6/2002 | Tsai et al. | 252/79.1 |
| 2002/0171118 | A1 * | 11/2002 | Mandelman et al. | 257/510 |
| 2003/0129840 | A1 | 7/2003 | Kumar | |
| 2004/0094777 | A1 | 5/2004 | Fichtl | |
| 2004/0161931 | A1 * | 8/2004 | Parthasarathy et al. | 438/689 |
| 2004/0245558 | A1 | 12/2004 | Manger | |
| 2004/0266098 | A1 * | 12/2004 | Huang et al. | 438/243 |

FOREIGN PATENT DOCUMENTS

| | | |
|---|---|---|
| TW | 466684 | 12/2001 |
| TW | 488067 | 5/2002 |
| TW | 525295 | 3/2003 |
| TW | 536816 | 6/2003 |
| TW | 550801 | 9/2003 |
| TW | I223412 | 11/2004 |
| TW | I227546 | 2/2005 |
| TW | I240361 | 9/2005 |

* cited by examiner

METHOD OF MANUFACTURING A CAPACITOR DEEP TRENCH AND OF ETCHING A DEEP TRENCH OPENING

CROSS REFERENCE TO RELATED APPLICATIONS

This application is a division of U.S. application Ser. No. 11/306,560 filed Jan. 3, 2006, and incorporated herein by reference in its entirety.

BACKGROUND OF THE INVENTION

1. Field of the Invention

A method of manufacturing a capacitor deep trench and of etching a deep trench opening is provided in the present invention, where, more particularly, the method forms an STI first, and then etches the deep trench opening.

2. Description of the Prior Art

The miniaturization of various electrical products is a recent trend. In current semiconductor integrated circuits manufacturing, the memory cell and the high speed logic circuit elements of a dynamic random access memory (DRAM) are integrated in one chip. This creates an embedded dynamic random access memory (EDRAM), which combines the memory array and logic circuits to decrease the area of the chip and increase the speed of dealing with data.

The DRAM needs to be designed to suit the high accumulation and high density, so a capacitor deep trench is currently applied to the high density DRAM. The manufacturing method of the capacitor deep trench includes etching a deep trench (DT) in a semiconductor substrate, and forming a buried plate, a capacitor dielectric layer and a poly-silicon conductive layer. There is shallow trench isolation (STI) to insulate the capacitor deep trench and the adjacent capacitor deep trench. Therefore, the size of the memory cell becomes smaller and the chip space is well arranged.

Please refer to FIGS. 1-4. FIGS. 1-4 are diagrams of the manufacture of the capacitor deep trench and STI according to the prior art. As FIG. 1 shows, a semiconductor chip 10 is divided into a logic area 16 and a memory array area 14. In FIG. 1, the memory array area 14 of the semiconductor chip 10 has a plurality of capacitor deep trenches 18. In general, the capacitor deep trench 18 manufacture includes etching the deep trench opening (not shown) in the silicon substrate 12 by a silicon oxide layer 19 and a silicon nitride layer 20 as a hard mask. Then, a buried plate, (not shown), which is the storage node of the capacitor deep trench 18 for a storage electron or hole is formed in the opening of the silicon substrate 12 by arsenic silicate glass (ASG) diffusion. Then, the capacitor dielectric layer 22 is formed in the opening of the silicon substrate 12 by doping and thermal oxidation processes. Finally, a conductive layer is filled in the opening as a capacitor lower electrode 24, and the capacitor deep trench 18 is finished. The capacitor dielectric layer 22 is made from silicon oxide, silicon nitride, and silicon oxide (ONO). The capacitor lower electrode 24 is made from poly-silicon filled in the deep trench opening (not shown).

Next, as FIG. 2 shows, the silicon nitride layer 20 is smeared with a photo resist layer. The photo resist layer is patterned by the prior PEP, and is backed to form a photo resist mask which defines the memory array area 14 of the STI photo resist opening 30 and the logic area 16 of the STI photo resist opening 32.

As FIG. 3 shows, a plasma dry etching process is provided. For example: the etcher is set, the top power is 600 watts (W), and the bottom power is 100 W. Tetrafluoromethane ($CF_4$) is a reactive gas and passes 80 standard cubic centimeters per minute (sccm) every minute. The photo resist mask is an etching mask and the silicon nitride layer 20 is etched from the STI photo resist opening 30, 32. Then, the reaction condition of the etcher is reset. The top power is 500 watts (W), and the bottom power is 60 W. Sulfur Hexafluoride ($SF_6$) is a reactive gas and passes 18 sccm/min. Oxygen ($O_2$) passes 14 sccm/min and Helium (He) passes 100 sccm/min to help the reaction. The silicon oxide layer 19, the silicon substrate 12, part of the capacitor lower electrode 24 and part of the capacitor dielectric layer 22 are etched by the STI photo resist opening 30, 32 to form the STI opening 34 in the memory array area 14 and the STI opening 36 of the logic area 16 at the same time. It should be mentioned that when the silicon oxide layer 19, the silicon substrate 12 and part of the capacitor dielectric layer 22 are etched, He can be utilized to remove the polymer caused by the etching process to avoid the polymer affecting the etching effect.

Finally, as FIG. 4 shows, a trench insulation material is filled in the memory array area 14 of the STI opening 34 and the logic area 16 of the STI opening 36. The trench insulation material is flattened by CMP. The STI 38 of capacitor deep trench 18 is finished.

Please refer to FIG. 5. FIG. 5 is a diagram of the capacitor dielectric layer etched incompletely according to the prior art. As FIG. 5 shows, because forming the STI opening 34 requires etching the silicon nitride layer 20, the silicon oxide layer 19, the silicon substrate 12, part of the capacitor lower electrode 24, and part of the capacitor dielectric layer 22 firstly, then, the silicon substrate 12 can form part of the STI opening 34. However, the capacitor dielectric layer 22 is made from a silicon oxide, silicon nitride, silicon oxide layer (ONO), and the hard mask of the deep trench opening is also made from the silicon nitride, therefore the etching process has a poor effect on the ONO capacitor dielectric layer 22. The part of the capacitor dielectric layer 22 is etched incompletely causing the capacitor dielectric layer residue 52, and the STI opening 34 to be damaged.

The manufacture of the capacitor deep trench and STI in the prior art forms the capacitor deep trench firstly, and then forms the STI, where the STI opening of the logic area, and the memory array area in the semiconductor chip are made together. The STI opening of the logic area is only formed on the silicon substrate. Forming the STI opening of the memory array area requires etching the partial capacitor deep trench, making it difficult to control the STI opening plasma etching process, so capacitor dielectric layer residue occurs. Another problem that can occur is, when the logic area and the memory array area are etched for the STI opening, the uniform and position of the STI opening etching in the logic area can be affected, and a complex computer program is needed to amend the etching process. Even more etching processes are processed to form the STI opening of the logic area and the memory array area individually.

Because the prior art has the above-mentioned shortcomings, how to invent a better etching process to form the STI opening of the logic area and the memory area is an important issue.

SUMMARY OF THE INVENTION

The present invention discloses a method of etching a deep trench opening, comprising an STI between a silicon substrate, a silicon oxide layer and a silicon nitride layer stacked structure, a pattern poly silicon being a mask for a first etching process to etch the silicon nitride layer, the silicon oxide layer, the STI, and the deep trench opening being formed.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
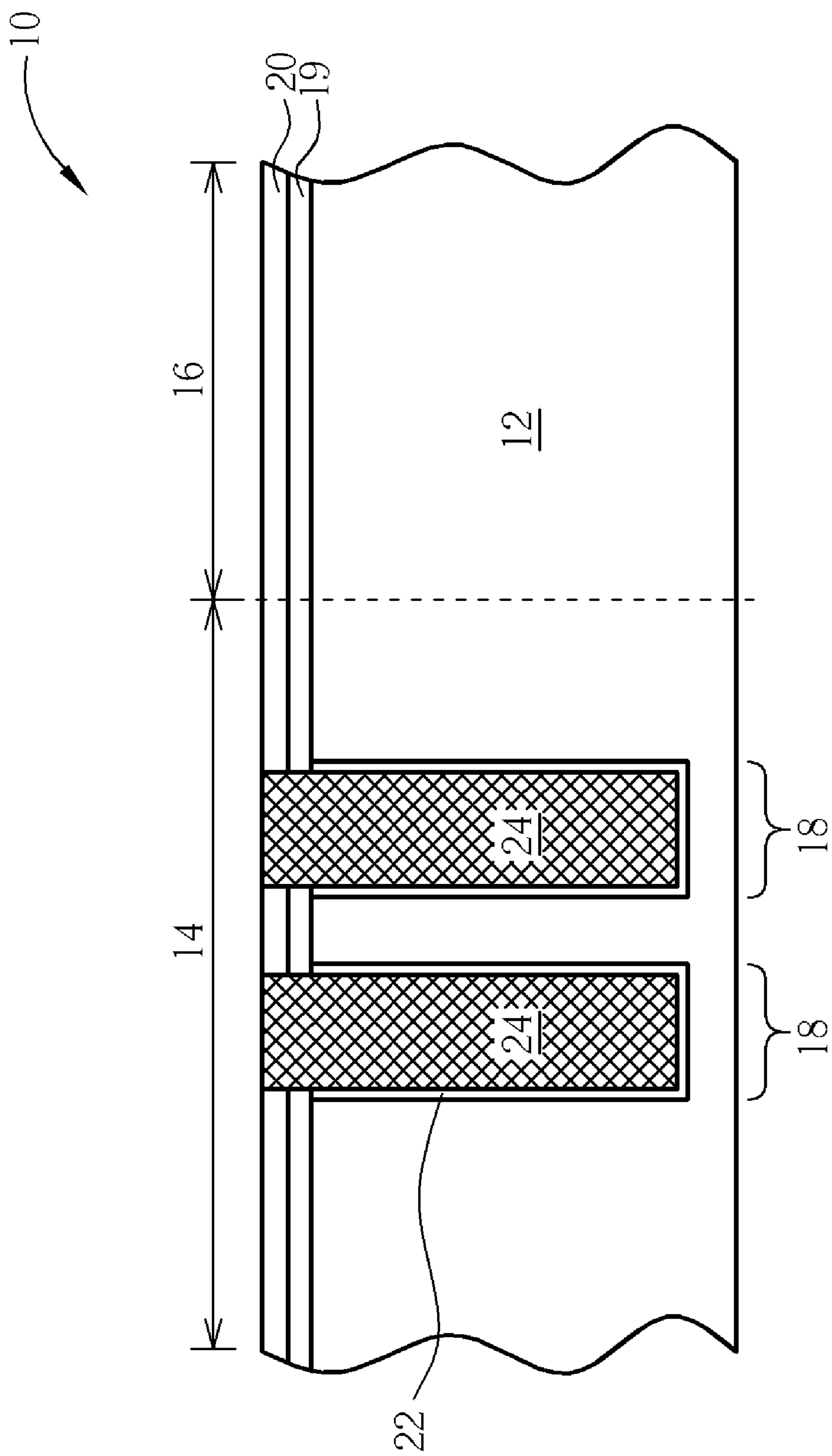
FIGS. 1-4 are diagrams of the manufacture of the capacitor deep trench and STI according to the prior art.
Figure 2:
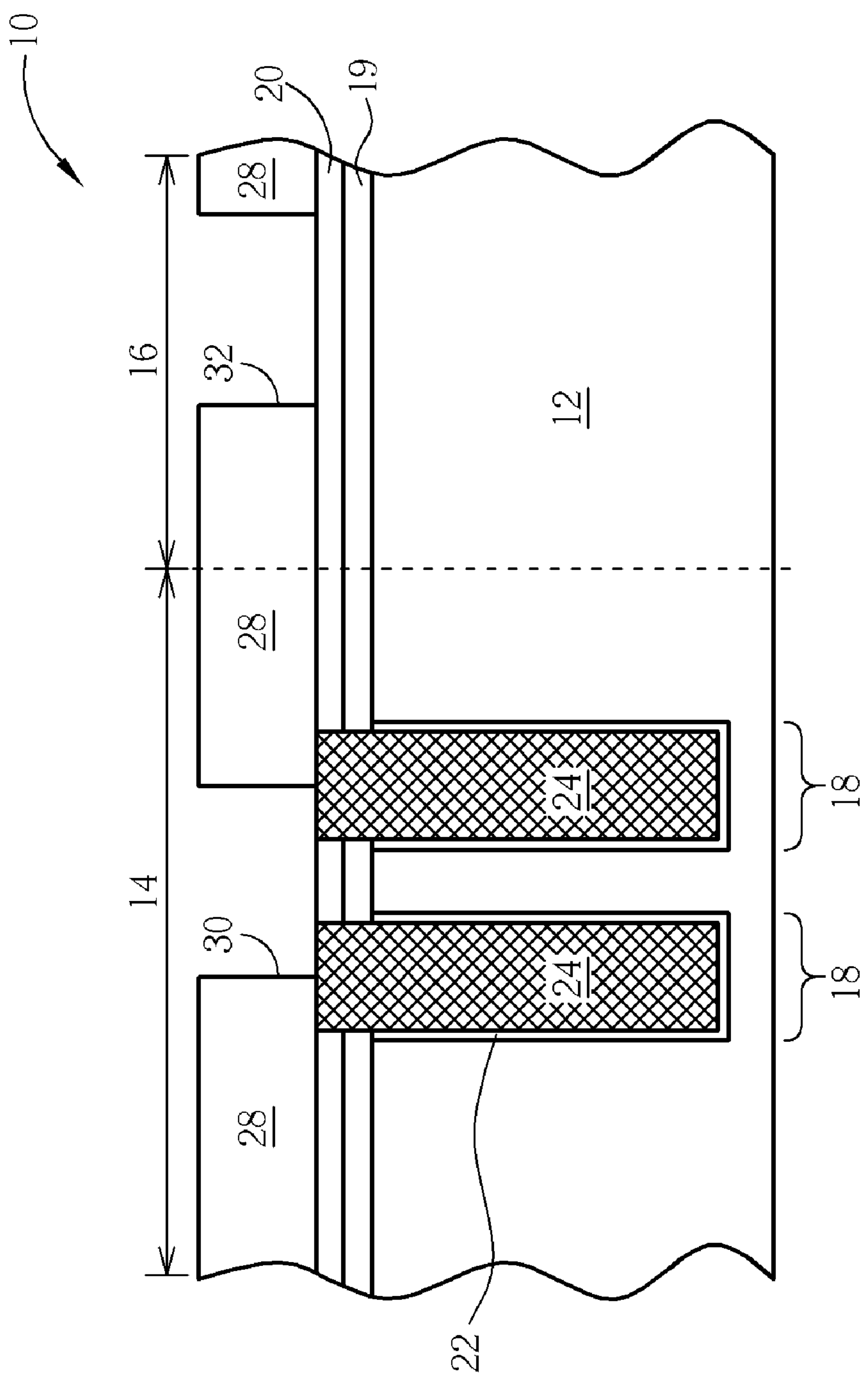
Figure 3:
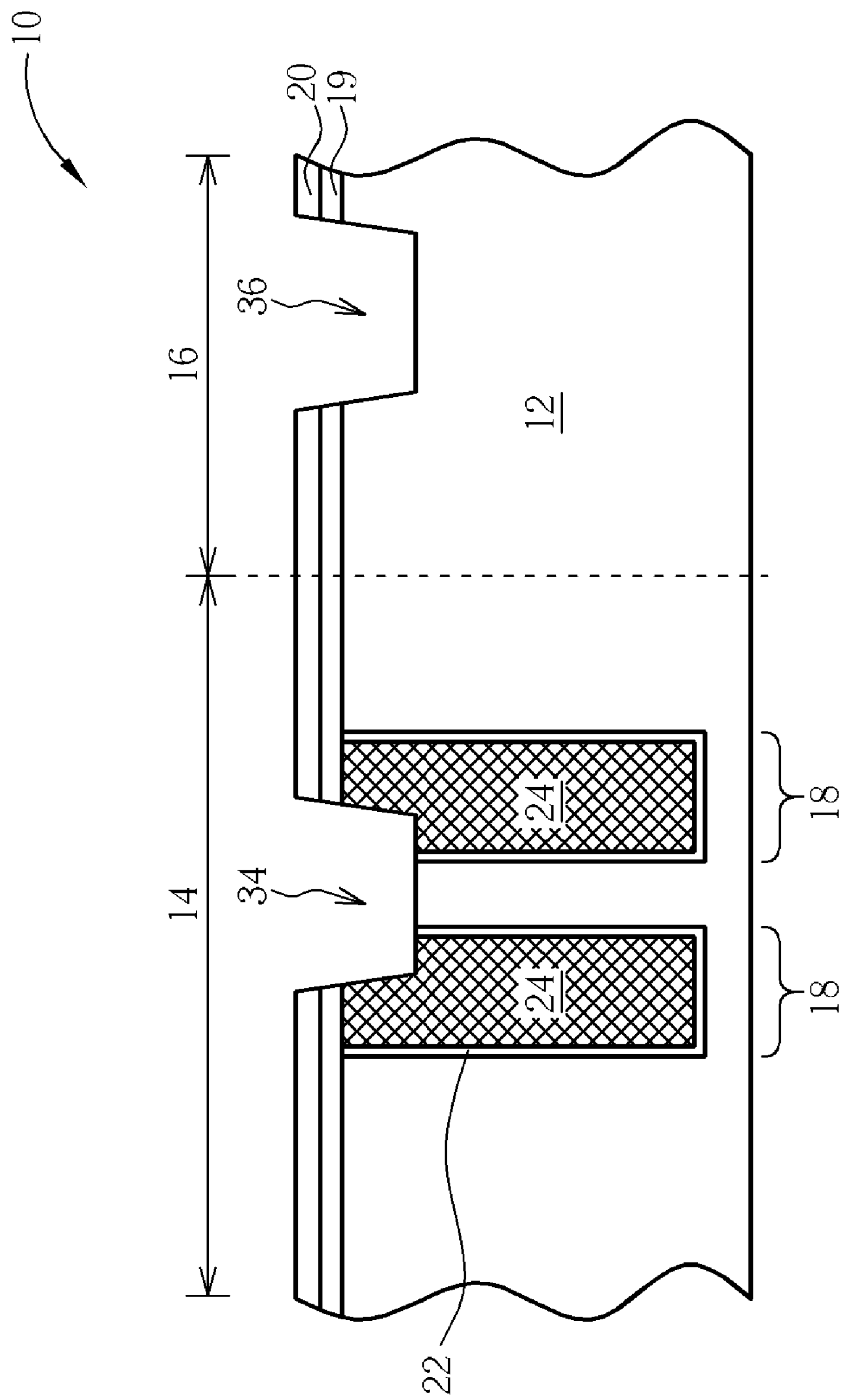
Figure 4:
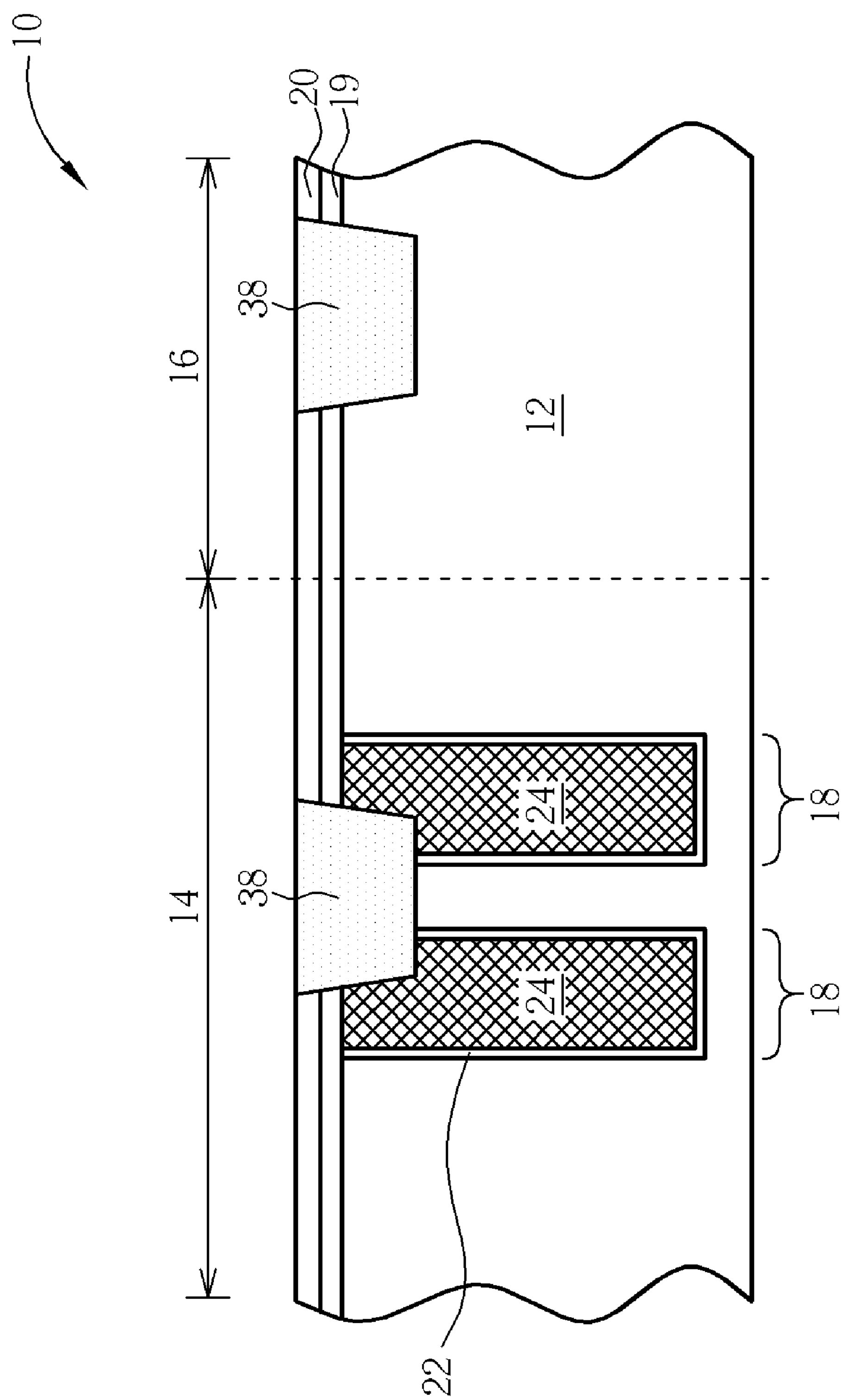
Figure 5:
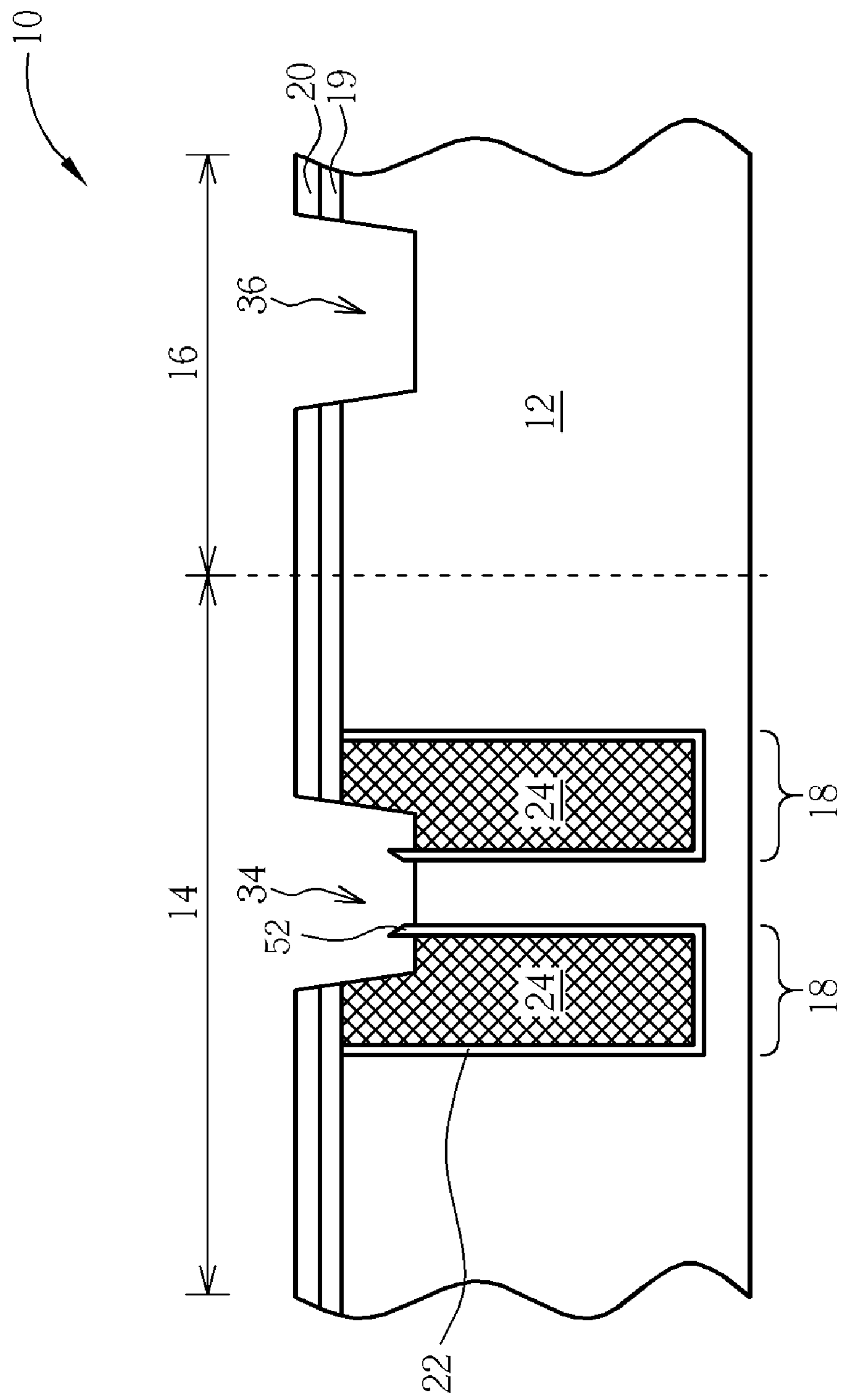
FIG. 5 is a diagram of the capacitor dielectric layer etched incompletely according to the prior art.
Figure 6:
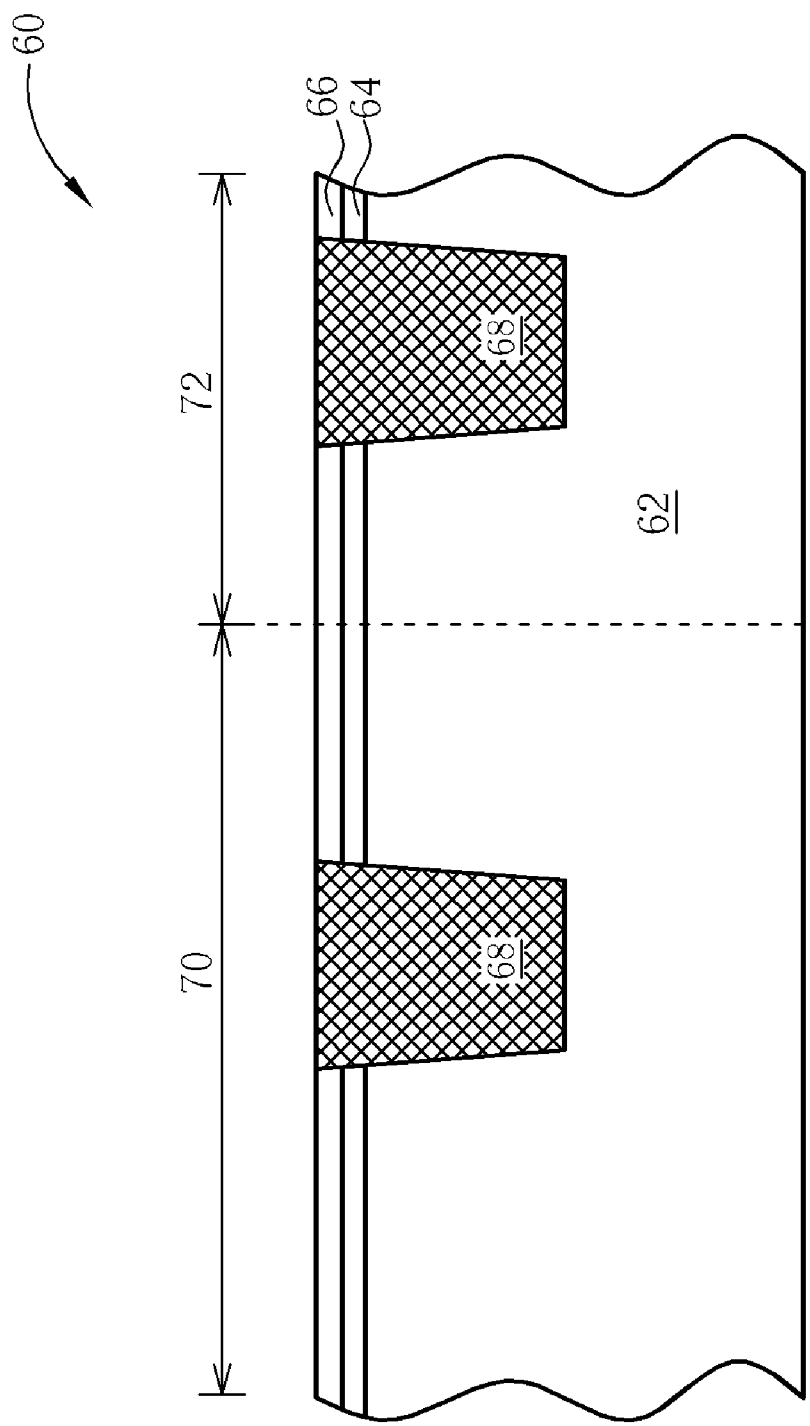
FIGS. 6-9 are diagrams of the deep trench opening manufacture according to the present invention.

Please refer to FIGS. 6-9. FIGS. 6-9 are diagrams of the deep trench opening manufacture according to the present invention. As FIG. 6 shows, a substrate is provided, where the substrate could be an SOI substrate or a semiconductor chip 60. The semiconductor chip 60 is divided into a logic area 72 and a memory array area 70. The logic area 72 and the memory array area 70 have an STI 68 at first. In general, the manufacture of the STI 60 includes doping a silicon oxide layer 64 and silicon nitride layer 66 on the silicon substrate 62 of the semiconductor chip 60. Then, an opening of the STI 68 is etched by a photo mask and a photo-etching-process (PEP). Dielectric material is filled in the opening and a CMP is processed to finish the STI 68 manufacture as shown in FIG. 6. This process is well known by those skilled in the art, so a detailed description is not included.

Figure 7:
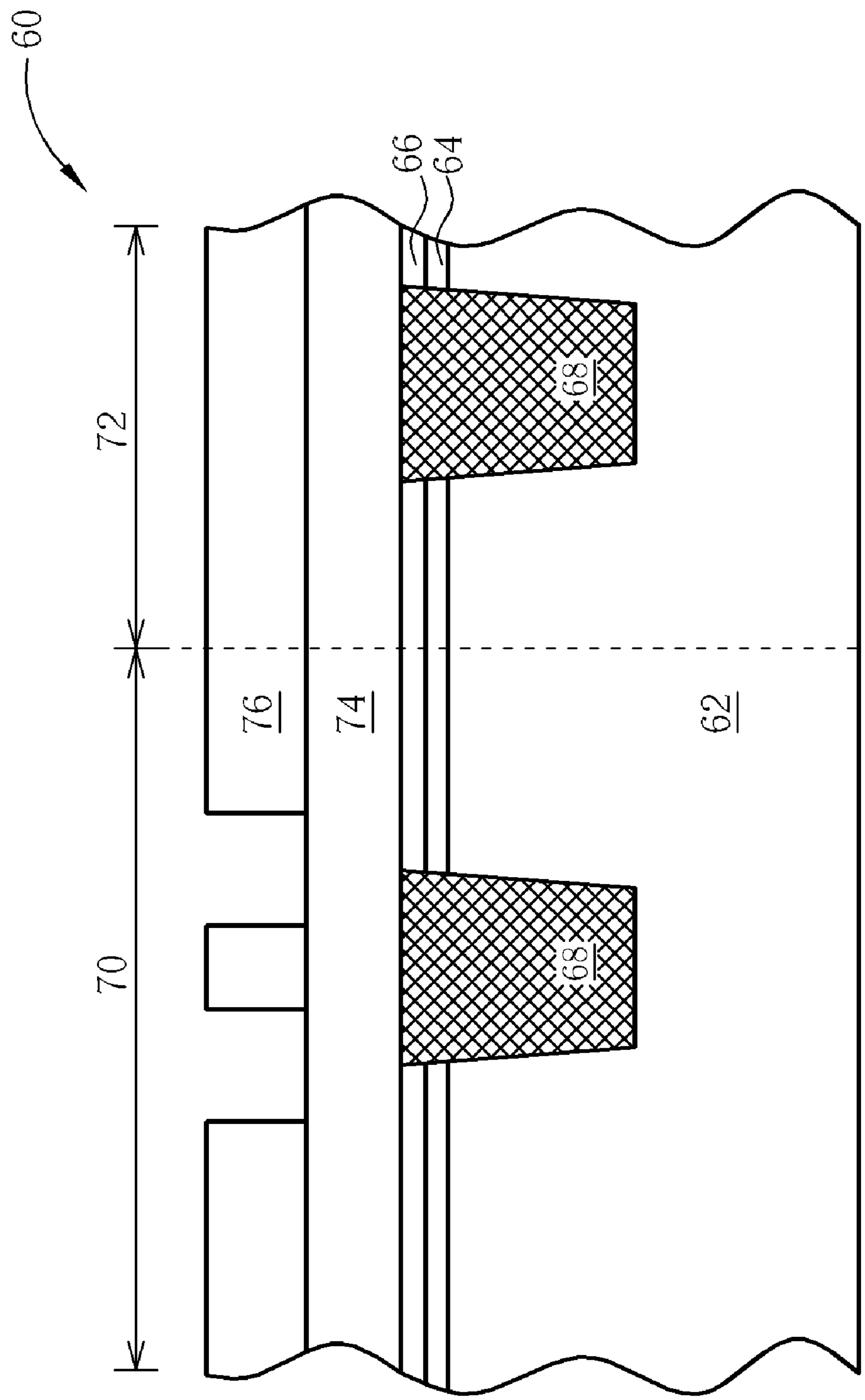

Next, as FIG. 7 shows, the silicon substrate 62 is doped with a silicon nitride layer 74 and a poly-silicon layer (not shown). A photo resist (not shown) is smeared on the poly-silicon layer. The photo resist is patterned by the PEP to form a pattern photo resist (not shown) which defines a deep trench opening 82 of a memory array area 70. Otherwise, in the other embodiment, the poly-silicon layer could be doped with a bottom anti reflective coating (BARC) (not shown) to enforce the exposure effect of the photo resist.

Please continue to refer to FIG. 7. Before a pattern poly-silicon layer 76 is formed, the pattern photo resist (the poly-silicon layer etching mask) needs to be baked at a temperature between 15° C. and 45° C. The etcher passes Hydrobromide (HBr) at 100-250 sccm/min, $SF_6$ at 5-15 sccm/min, and $CF_4$ at 3-9 sccm/min to be the etching reactive gases. The top power of the etcher remains 500-1500 W for the etching process. The silicon nitride layer 74 is the etching stop layer. Then the pattern poly-silicon layer 76 is formed, and the pattern photo resist (not shown) is removed.

Figure 8:
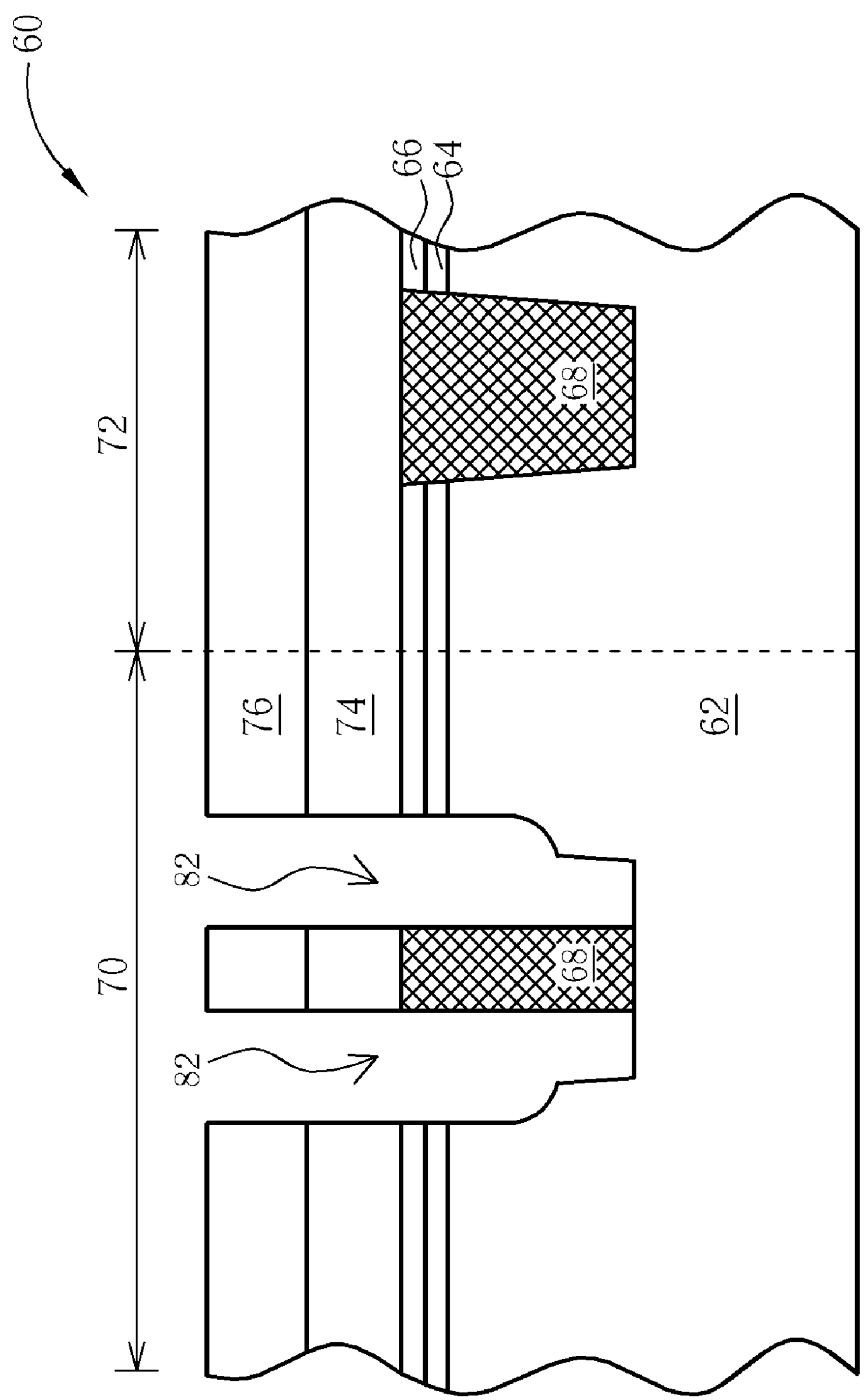

Then, as FIG. 8 shows, the pattern poly-silicon layer 76 is the hard mask for the silicon nitride layer 74, 66 and the silicon oxide layer 64 etching process. The pattern poly-silicon layer 76 is also the hard mask of the deep trench opening 82 etching process. The etcher utilizes $CF_4$ at 40-120 sccm/min, and Trifluoromethane ($CHF_3$) at 50-150 sccm/min to be the etching reactive gases. The silicon nitride layer 74, 66, the silicon oxide layer 64, the silicon substrate 62, and the STI 68 are etched to form the deep trench opening 82 as FIG. 8 shows. It should be mentioned that, except for the above-mentioned etching condition, $CF_4$ at 55-165 sccm/min, and $CHF_3$ at 35-105 sccm/min could continue to be utilized as the reactive gases for a better etching effect. This is because the high concentration $CF_4$ could remove the etching residue and the deep trench opening 82 could be etched deeper, when $CF_4$ etches the silicon nitride layer 74, 66, the silicon oxide layer 64, the silicon substrate 62, and the STI 68.

Figure 9:
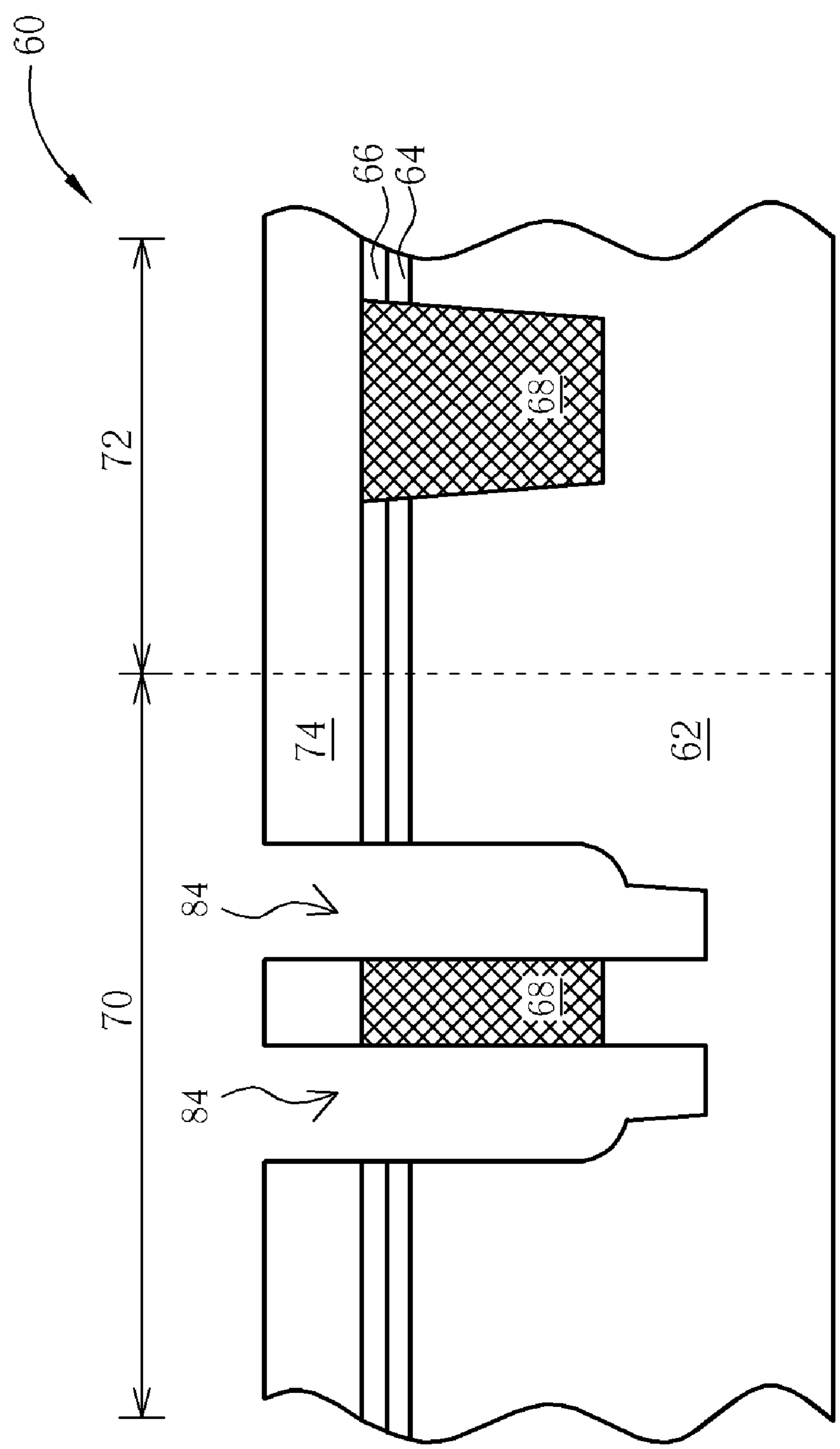

Please refer to FIG. 9. A dry etching process is utilized to remove the pattern poly-silicon layer 76 and to deepen the deep trench opening 82. Because the silicon substrate 62 and the pattern poly-silicon layer 76 are made from the same material, they could be etched by the same dry etching process. So, the dry etching process for removing the pattern poly-silicon layer 76 could also be utilized to deepen the deep trench opening 82. The etching condition of removing the pattern poly-silicon layer 76 sets the top power of the etcher as 300-900 W, and the bottom power as 50-150 W. The etcher utilizes $CF_4$ at 40-120 sccm/min to be the reactive gas for a break through etching process. The nitride residue from the former etching process is removed. Then, the etcher sets the top power as 250-750 W, the bottom power as 30-90 W, and utilizes $SF_6$ at 9-27 sccm/min as the reactive gas. $O_2$ passes in the etcher at 7-21 sccm/min for accelerating the reactive speed. The pattern poly-silicon layer 76 is removed and the deep trench opening 82 is deepened. Otherwise, in this dry etching process, He could be utilized to remove the polymer from etching at any phase of the etching process, and the etching process of removing the pattern poly-silicon layer 76 and deepening the deep trench opening 84 could be continued. Utilizing He avoids creation of the etching residue, which affects the etching effect. Finally, a buried plate, (not shown), which is the storage node of the capacitor deep trench 84 for a storage electron or hole is formed in the opening of the silicon substrate 62 by arsenic silicate glass (ASG) diffusion. Then, the capacitor dielectric layer (not shown) such as ONO material is formed in the silicon substrate surface 62 in the deep trench opening 84 by doping and thermal oxidation processes. Finally, a conductive layer such as a poly-silicon layer is filled and the capacitor deep trench (not shown) is formed.

It should be mentioned that the STI 68, the silicon nitride layer 66, 74, and the pattern poly-silicon layer 76 have a suitable thickness range in this better embodiment. For example, the thickness of the STI 68 is 3000-5000 Å, the thicknesses of the silicon nitride layer 66, 74 are 1000-3000 Å, and the thickness of the pattern poly-silicon layer 76 is 1000-3000 Å. The purpose of the silicon nitride layer 74 doped on the silicon nitride layer 66 and the STI 68 is to enable polishing by the chemical mechanical polish (CMP) of the capacitor deep trench manufacture. If the silicon nitride layer 74 is not doped on the silicon nitride layer 66, the thickness of the silicon nitride layer 66 is not enough for the CMP of the capacitor deep trench manufacture. So, doping the silicon nitride layer 74 is necessary. The thickness of each layer is related to the etching thickness of the etching process. The thickness of the STI 68, the silicon nitride layer 66, 74 and pattern poly-silicon layer 76 are designed according to manufacturing requirements. The data given in the description of the better embodiment in the present invention is for illustrating the idea of the invention, but should not be taken as a limitation.

Figure 10:
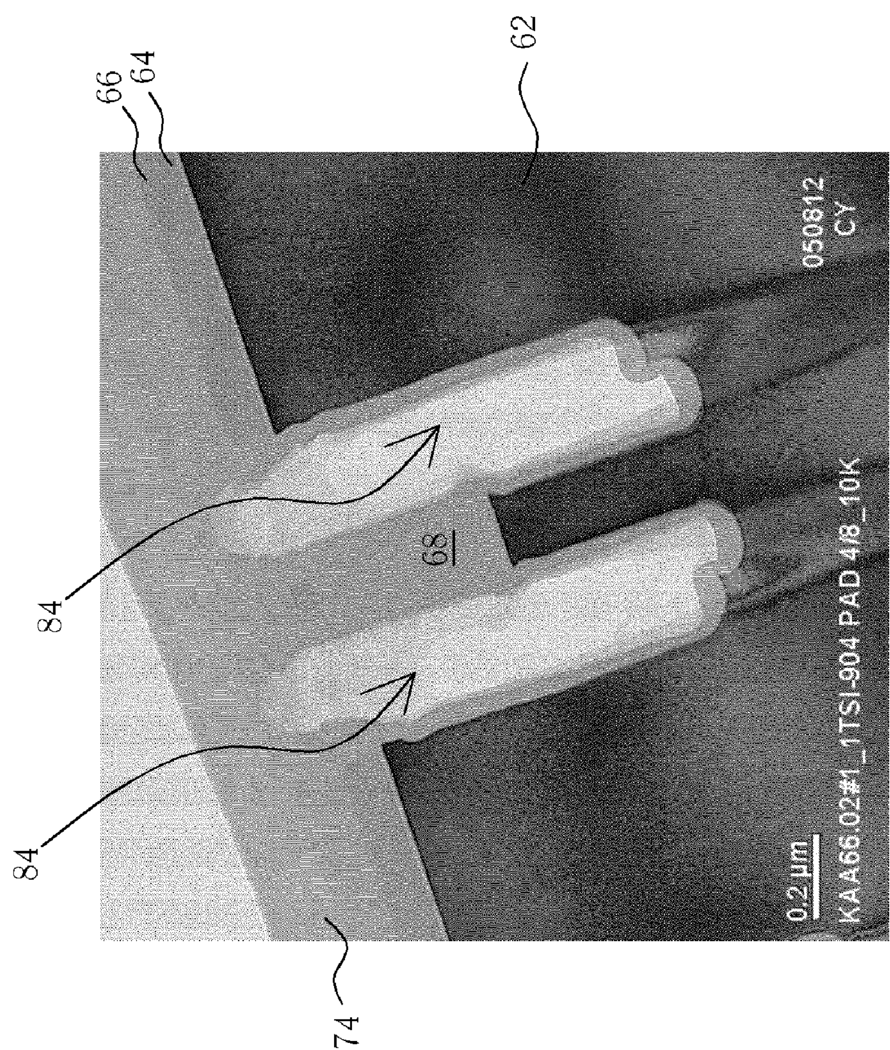
FIG. 10 is an SEM photograph of the deep trench opening according to the present invention.

Please refer to FIG. 10. FIG. 10 is an SEM photograph of the deep trench opening according to the present invention. As FIG. 10 shows, the silicon oxide layer 64 and the silicon nitride layer 66, 74 are stacked on the silicon substrate 62. These two deep trench openings 84 clip the STI 68. Because the present invention is formed, the STI 68 can then be etched in the deep trench opening 84, and therefore the capacitor dielectric layer residue will not occur. Furthermore, the present invention utilizes the pattern poly-silicon layer 76 as the hard mask for etching the silicon oxide layer 64 and the silicon nitride layer 74, 66. This is a simpler process for the deep trench opening etching process. When the pattern poly-silicon layer 76 is removed, the silicon nitride layer 74, 66 could be the hard mask of etching the silicon substrate 62, and the deep trench opening 82 is deepened into the silicon substrate 62. This not only simplifies the process, but also supplies the capacitor deep trench of the present invention with a bigger capacitor area.

The present invention forms the capacitor deep trench first. In the prior art, the STI is formed firstly, and the capacitor deep trench secondly, so the present invention does not have a capacitor dielectric layer residue in the STI opening. Furthermore, the present invention does not need more etching processes or a computer program for improving the etching effect, as required by the prior art. Moreover, the present invention utilizes the pattern poly-silicon layer as the hard mask to etch the silicon oxide layer and two silicon nitride layers. When the pattern poly-silicon layer is removed, the silicon nitride layer could be the hard mask for etching the silicon substrate, so the deep trench opening is deepened into the silicon substrate. This not only simplifies the process, but also supplies the capacitor deep trench of the present invention with a bigger capacitor area.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of etching a deep trench opening, comprising:

forming a shallow trench isolation filled with a dielectric material in a silicon substrate, a silicon oxide layer, and a silicon nitride layer stacked structure;

performing a first etching process to etch the silicon nitride layer stacked structure, the silicon oxide layer, and the shallow trench isolation by using a polysilicon pattern as mask formed on the shallow trench isolation for forming a deep trench opening; and utilizing a third etching process to remove the polysilicon pattern after the deep trench opening is formed by the first etching process, wherein the third etching process etches the silicon substrate to deepen the trench opening.

2. The method of claim 1, wherein the poly silicon pattern is made by a second etching process.

3. The method of claim 2, wherein the second etching process comprises a patterned photo resist layer to be an etching mask.

4. The method of claim 3, wherein the second etching process comprises utilizing Tetrafluoromethane ($CF_4$), Hydrobromide (HBr), Sulfur Hexafluoride ($SF_6$), or combination thereof for etching.

5. The method of claim 4, wherein the second etching process utilizes the silicon nitride layer stacked structure to be an etching stop layer.

6. The method of claim 1, wherein the first etching process comprising utilizing a $CF_4$ for etching.

7. The method of claim 1, wherein the first etching process comprises utilizing a Trifluoromethane ($CHF_3$) for etching.

8. The method of claim 1, wherein the first etching process comprises utilizing a $CF_4$ and $CF_3$ for etching.

9. The method of claim 1, wherein the third etching process comprises utilizing a $CF_4$ for etching.

10. The method of claim 1, wherein the third etching process comprises utilizing a $SF_6$ for etching.

11. The method of claim 1, wherein the third etching process comprises utilizing a $CF_4$ and a $SF_6$ for etching.

12. A method of etching a deep trench opening, comprising:

forming a shallow trench isolation filled with a dielectric material in a silicon substrate, a silicon oxide layer, and a silicon nitride layer stacked structure; and performing a first etching process to etch the silicon nitride layer stacked structure, the silicon oxide layer, and the shallow trench isolation by using a polysilicon pattern as mask formed on the shallow trench isolation for forming a deep trench opening, wherein the polysilicon pattern is made by a second etching process, the second etching process comprises a patterned photo resist layer to be an etching mask, the second etching process comprises utilizing Tetrafluoromethane ($CF_4$), Hydrobromide (HBr), Sulfur Hexafluoride ($SF_6$), or combination thereof for etching, and the second etching process utilizes the silicon nitride layer stacked structure to be an etching stop layer.

13. The method of claim 12, further comprising utilizing a third etching process to remove the pattern poly silicon layer, after the deep trench opening is formed by the first etching process.

14. The method of claim 13, wherein the third etching process etches the silicon substrate to deepen the deep trench opening.

15. The method of claim 14, wherein the third etching process comprises utilizing a $CF_4$ for etching.

16. The method of claim 14, wherein the third etching process comprises utilizing a $SF_6$ for etching.

17. The method of claim 14, wherein the third etching process comprises utilizing a $CF_4$ and a $SF_6$ for etching.

* * * * *